United States Patent
Wang et al.

(10) Patent No.: US 11,733,298 B2
(45) Date of Patent: Aug. 22, 2023

(54) TWO-PORT ON-WAFER CALIBRATION PIECE CIRCUIT MODEL AND METHOD FOR DETERMINING PARAMETERS

(71) Applicant: THE 13TH RESEARCH INSTITUTE OF CHINA ELECTRONICS TECHNOLOGY GROUP CORPORATION, Shijiazhuang (CN)

(72) Inventors: Yibang Wang, Shijiazhuang (CN); Aihua Wu, Shijiazhuang (CN); Faguo Liang, Shijiazhuang (CN); Chen Liu, Shijiazhuang (CN); Ye Huo, Shijiazhuang (CN); Peng Luan, Shijiazhuang (CN); Jing Sun, Shijiazhuang (CN); Yanli Li, Shijiazhuang (CN)

(73) Assignee: The 13th Research Institute of China Electronics Technology Group Corporation, Shijiazhuang (CN)

( * ) Notice: Subject to any disclaimer, the term of this patent is extended or adjusted under 35 U.S.C. 154(b) by 85 days.

(21) Appl. No.: 17/550,930

(22) Filed: Dec. 14, 2021

(65) Prior Publication Data

US 2022/0107361 A1 Apr. 7, 2022

Related U.S. Application Data

(63) Continuation of application No. PCT/CN2021/096855, filed on May 28, 2021.

(30) Foreign Application Priority Data

Aug. 14, 2020 (CN) .......................... 202010819047.6
Aug. 14, 2020 (CN) .......................... 202010820400.2

(51) Int. Cl.
*G01R 31/26* (2020.01)
*G01R 31/319* (2006.01)

(52) U.S. Cl.
CPC ..... *G01R 31/3191* (2013.01); *G01R 31/2601* (2013.01)

(58) Field of Classification Search
CPC ...... G01R 31/26; G01R 31/319; G01R 27/32; G01R 31/2601; G01R 31/2837; G01R 31/3191; G01R 35/005
(Continued)

(56) References Cited

U.S. PATENT DOCUMENTS

2017/0192079 A1 7/2017 Huang
2022/0003811 A1* 1/2022 Wu ....................... G01R 35/005

FOREIGN PATENT DOCUMENTS

CN 102508034 A * 6/2012 ............. G01R 27/02
CN 108062442 A * 5/2018 ............. G06F 30/23
(Continued)

OTHER PUBLICATIONS

Jarndal et al. A New Small-Signal Modeling Approach Applied to GaN Devices IEEE Tran. on Microwave Theory and Techniques, vol. 53, No. 11, Nov. 2005 (Year: 2005).*
(Continued)

*Primary Examiner* — Eman A Alkafawi
*Assistant Examiner* — Courtney G McDonnough
(74) *Attorney, Agent, or Firm* — AP3 Law Firm PLLC

(57) ABSTRACT

The present application provides two-port on-wafer calibration piece circuit models and a method for determining parameters. The method includes: measuring a single-port on-wafer calibration piece circuit model corresponding to a first frequency band to obtain a first S parameter; calculating, according to the first S parameter, an intrinsic capacitance value of a two-port on-wafer calibration piece circuit model corresponding to the single-port on-wafer calibration piece circuit model; measuring the two-port on-wafer calibration piece circuit model corresponding to the terahertz
(Continued)

frequency band to obtain a second S parameter; and calculating a parasitic capacitance value and a parasitic resistance value of the two-port on-wafer calibration piece circuit model according to the second S parameter and the intrinsic capacitance value.

2 Claims, 6 Drawing Sheets

(58) Field of Classification Search
USPC .......................................................... 324/750
See application file for complete search history.

(56) References Cited

FOREIGN PATENT DOCUMENTS

| CN | 109444717 A | 3/2019 |
| CN | 109444782 A | 3/2019 |
| CN | 109581259 A | 4/2019 |
| CN | 110286345 A | 9/2019 |
| CN | 110286347 A | 9/2019 |
| CN | 111142057 A | 5/2020 |

OTHER PUBLICATIONS

Translated CN 102508034 A (Year: 2012).*
Translated CN 108062442 A (Year: 2018).*

* cited by examiner

TWO-PORT ON-WAFER CALIBRATION PIECE CIRCUIT MODEL AND METHOD FOR DETERMINING PARAMETERS

CROSS-REFERENCE TO RELATED APPLICATIONS

This application is a continuation application of International Application No. PCT/CN 2021/096855, filed on May 28, 2021, which claims priority to Chinese Patent Application No. CN 202010819047.6 and Chinese Patent Application No. CN 202010820400.2, both filed on Aug. 14, 2020. The disclosures of the aforementioned applications are hereby incorporated herein by reference in their entireties.

TECHNICAL FIELD

The present application relates to the technical field of measurement of microwave characteristics of wafer level semiconductor devices, and in particular, a two-port on-wafer calibration piece circuit model and a method for determining parameters.

BACKGROUND

An "on-wafer S parameter test system" is widely used in the microelectronics industry. Before use, an on-wafer calibration piece needs to be used to perform vector calibration on the on-wafer S parameter test system. The accuracy of calibration depends on the accuracy of on-wafer calibration piece definition. Measurement circuit models of different types of calibration pieces (such as an open-circuit calibration piece, a short-circuit calibration piece, a load calibration piece, and a straight-through calibration piece) have different values of lumped parameters. The lumped parameters generally include a delay of an offset line, a characteristic impedance, a series resistance, an inductance, a capacitance, and a direct current resistance. However, in the prior art, measurement circuit models of traditional commercial on-wafer calibration pieces only represent a single-port calibration piece circuit model. In the terahertz frequency band, due to the coupling between probes, an error is generated when the traditional single-port calibration piece circuit model is used to calibrate two ports of an on-wafer test system, resulting in a decrease in the accuracy of calibration and testing.

SUMMARY

These and other problems are generally solved or circumvented, and technical advantages are generally achieved, by embodiments of the present disclosure which provide two-port on-wafer calibration piece circuit models and a method for determining parameters of the two-port on-wafer calibration piece circuit models.

Technical Problems

The present application provides two-port on-wafer calibration piece circuit models and a method for determining parameters of the two-port on-wafer calibration piece circuit models, and aim to solve the problem of a decrease in the accuracy of calibration and testing caused by the fact that an error is generated when a traditional single-port calibration piece circuit model is used to calibrate two ports of an on-wafer test system in the prior art.

Technical Solutions

In order to solve the above technical problem, a first aspect of the embodiments of the present application provides a two-port on-wafer calibration piece circuit model, including a first intrinsic capacitor, a first parasitic capacitor, and a first parasitic resistor. The first intrinsic capacitor, the first parasitic resistor, and the first parasitic resistor are respectively connected in parallel to form a first parallel circuit; one end of the first parallel circuit is connected with a first single-port on-wafer calibration piece circuit model; and the other end of the first parallel circuit is connected with a second single-port on-wafer calibration piece circuit model.

As one embodiment of the present application, the first single-port on-wafer calibration piece circuit model and the second single-port on-wafer calibration piece circuit model are the same circuit models. That is, the two circuit models have same components and circuit layout.

As one embodiment of the present application, each of the first single-port on-wafer calibration piece circuit model and the second single-port on-wafer calibration piece circuit model comprises a crosstalk resistor $R_S$, a crosstalk capacitor $C_S$ and a first original single-port calibration piece circuit model, the crosstalk capacitor $R_S$ and the crosstalk resistor $C_S$ being connected in parallel and forming a second parallel circuit, and the second parallel circuit being connected in parallel to the first original single-port calibration piece circuit model; the second parallel circuit is connected between two ends of a port of the first original single-port calibration piece circuit model, and a first end of the second parallel circuit is connected to one of the two ends of the port of the first original single-port calibration piece circuit model to form a first connecting point.

As one embodiment of the present application, the first end of the first parallel circuit is connected to the first connecting point of the first single-port on-wafer calibration piece circuit model, and the second end of the first parallel is connected to the first connecting point of the second single-port on-wafer calibration piece circuit model.

In order to solve the above technical problem, a second aspect of the embodiments of the present application provides another two-port on-wafer calibration piece circuit model, including a second intrinsic capacitor, a second parasitic capacitor, and a second parasitic resistor. The second parasitic capacitor and the second parasitic resistor are connected in series to form a first series circuit; the first series circuit and the second intrinsic capacitor are connected in parallel to form a third parallel circuit; one end of the third parallel circuit is connected to the first single-port on-wafer calibration piece circuit model; and the other end of the third parallel circuit is connected to the second single-port on-wafer calibration piece circuit model.

As one embodiment of the present application, each of the third single-port on-wafer calibration piece circuit model and the fourth single-port on-wafer calibration piece circuit model comprises a crosstalk resistor $R_S'$, a crosstalk capacitor $C_S'$ and a second original single-port calibration piece circuit model. The crosstalk capacitor $R_S'$ and the crosstalk resistor $C_S'$ are connected in series and form a second series circuit, the second series circuit is connected in parallel to the second original single-port calibration piece circuit model, the second series circuit is connected between two ends of a port of the second original single-port calibration piece circuit model, and a first end of the second series circuit is connected to one of the two ends of the port of the second original single-port calibration piece circuit model to form a second connecting point; or, the crosstalk resistor $R_S'$ and the crosstalk capacitor $C_S'$ are connected in parallel and form a fourth parallel circuit, the fourth parallel circuit is connected in parallel to the second original single-port calibration piece circuit model, the fourth parallel circuit is connected between two ends of the second original single-port calibration piece circuit model, and a first end of the fourth parallel circuit is connected to one of the two ends of the port of the second original single-port calibration piece circuit model to form a third connecting point.

As one embodiment of the present application, when the crosstalk capacitor $R_S'$ and the crosstalk resistor $C_S'$ are connected in series, the first end of the third parallel circuit is connected to the second connecting point of the third single-port on-wafer calibration piece circuit model, and the second end of the third parallel circuit is connected to the second connecting point of the fourth single-port on-wafer calibration piece circuit model; or, when the crosstalk resistor $R_S'$ and the crosstalk capacitor $C_S'$ are connected in parallel, the first end of the third parallel circuit is connected to the third connecting point of the third single-port on-wafer calibration piece circuit model, and the second end of the third parallel circuit is connected to the third connecting point of the fourth single-port on-wafer calibration piece circuit model.

In order to solve the above technical problem, a third aspect of the embodiments of the present application provides a method for determining parameters in a two-port on-wafer calibration piece circuit model above. Based on the two-port on-wafer calibration piece circuit model, the method for determining parameters in the two-port on-wafer calibration piece circuit model includes: measuring a single-port on-wafer calibration piece circuit model corresponding to a first frequency band to obtain a first S parameter; calculating, according to the first S parameter, an intrinsic capacitance value of the two-port on-wafer calibration piece circuit model corresponding to the single-port on-wafer calibration piece circuit model; measuring the two-port on-wafer calibration piece circuit model corresponding to a terahertz frequency band to obtain a second S parameter; and calculating a parasitic capacitance value and a parasitic resistance value of the two-port on-wafer calibration piece circuit model according to the second S parameter and the intrinsic capacitance value.

As one embodiment of the present application, the calculating, according to the first S parameter, an intrinsic capacitance value of the two-port on-wafer calibration piece circuit model includes: performing first S matrix transformation according to a first S matrix corresponding to the first S parameter, so as to obtain $Y_{21}$ in a first Y matrix; calculating the intrinsic capacitance value of the two-port on-wafer calibration piece circuit model according to the $Y_{21}$.

As one embodiment of the present application, the performing first S matrix transformation according to a first S matrix corresponding to the first S parameter, so as to obtain $Y_{21}$ in a first Y matrix includes: obtaining $Y_{21}$ in the first Y matrix according to the $$\begin{cases} Y_{21} = \frac{-2S_{21}}{1+|S|+S_{11}+S_{22}} \\ |S| = S_{11} \cdot S_{22} - S_{21} \cdot S_{12} \end{cases},$$

where $Y_{21}$ represents an element in the first Y matrix; $S_{11}$, $S_{21}$, $S_{12}$, and $S_{22}$ respectively represent parameters in the first S matrix; and $|S|$ represents a determinant value of the first S matrix.

As one embodiment of the present application, the calculating the intrinsic capacitance value of the two-port on-wafer calibration piece circuit model according to the $Y_{21}$ includes: calculating the intrinsic capacitance value of the two-port on-wafer calibration piece circuit model according to $$C_i = \frac{-Y_{21}}{j\omega},$$

where $C_i$ represents the intrinsic capacitance value; j represents an imaginary number; and $\omega$ represents an angular frequency corresponding to the first frequency band.

As one embodiment of the present application, the calculating a parasitic capacitance value and a parasitic resistance value of the two-port on-wafer calibration piece circuit model according to the second S parameter and the intrinsic capacitance value includes: performing second S matrix transformation according to a second S matrix corresponding to the second S parameter, so as to obtain $Y_{21}'$ in a second Y matrix; calculating the parasitic capacitance value and the parasitic resistance value of the two-port on-wafer calibration piece circuit model according to the $Y_{21}'$ and the intrinsic capacitance value.

As one embodiment of the present application, the calculating the parasitic capacitance value and the parasitic resistance value of the two-port on-wafer calibration piece circuit model according to the $Y_{21}'$ and the intrinsic capacitance value includes: calculating the parasitic capacitance value and the parasitic resistance value of the two-port on-wafer calibration piece circuit model according to $$\begin{cases} -Y_{21}' - j*w'*C_i = \frac{1}{R_C} + j*w'*C_C \\ R_C = \frac{1}{\text{real}(-Y_{21}' - j*w'*C_i)} \\ C_C = \frac{\text{imag}(-Y_{21}' - j*w'*C_i)}{w'} \end{cases},$$

where $R_C$ represents a first parasitic capacitance value; $C_C$ represents a first parasitic resistance value; and $\omega'$ represents the angular frequency corresponding to the terahertz frequency band.

As one embodiment of the present application, the calculating the parasitic capacitance value and the parasitic resistance value of the two-port on-wafer calibration piece circuit model according to the $Y_{21}'$ and the intrinsic capacitance value includes: calculating the parasitic capacitance value and the parasitic resistance value of the two-port on-wafer calibration piece circuit model according to $$\begin{cases} \frac{1}{-Y_{21}' - j*w'*C_i'} = R_C' + \frac{1}{j*w'*C_C'} \\ R_C' = \text{real}\left(\frac{1}{-Y_{21}' - j*w'*C_i'}\right) \\ C_C' = \frac{1}{w \cdot \text{imag}\left(\frac{1}{Y_{21}' + j*w'*C_i'}\right)} \end{cases},$$

where $C_C'$ represents a second parasitic capacitance value; $R_C'$ represents a second parasitic resistance value; and $\omega'$ represents the angular frequency corresponding to the terahertz frequency band.

Advantageous Effects of the Disclosure

The present application provides a two-port on-wafer calibration piece circuit model and a method for determining parameters. Compared with the existing art, the two-port on-wafer calibration piece circuit model provided by the present application reduces calibration and measurement errors caused by imperfection of the original single-port calibration piece circuit model in the terahertz frequency band and improves the test accuracy of on-wafer S parameters in the terahertz frequency band. In addition, the present application further provides a method for calculating parameters in the two-port on-wafer calibration piece circuit model.

BRIEF DESCRIPTION OF THE DRAWINGS

In order to describe the technical solutions in the embodiments of the present application more clearly, drawings required to be used in the existing art and the embodiments will be briefly introduced below. Apparently, the drawings described below are only some embodiments of the present disclosure. Those of ordinary skill in the art also can obtain other drawings according to these drawings without doing creative work.

DETAILED DESCRIPTION OF ILLUSTRATIVE EMBODIMENTS

In the following description, for the purpose of illustration rather than limitation, specific details such as specific system structures and technologies are proposed for a thorough understanding of the embodiments of the present application. However, it should be clear to those skilled in the art that the present application can also be implemented in other embodiments without these specific details. In other cases, detailed descriptions of well-known systems, devices, circuits, and methods are omitted to avoid unnecessary details from obstructing the description of the present application.

In order to illustrate the technical solutions described in the present application, specific embodiments are used for description below.

Figure 1:
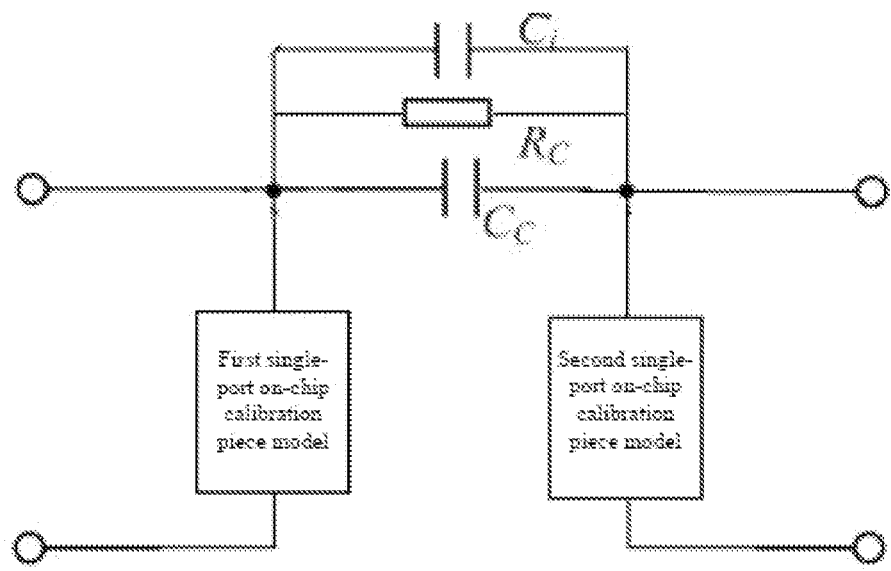
FIG. 1 is a schematic diagram of a two-port on-wafer calibration piece circuit model according to embodiments of the present application.

FIG. 1 is a schematic diagram of a two-port on-wafer calibration piece circuit model provided by one embodiment of the present application. For the convenience of illustration, parts that are related to the embodiment of the present application are illustrated only. As shown in FIG. 1, the two-port on-wafer calibration piece circuit model may include a first intrinsic capacitor $C_i$, a first parasitic capacitor $C_C$, and a first parasitic resistor $R_C$.

The first intrinsic capacitor $C_i$, the first parasitic resistor $C_C$, and the first parasitic resistor $R_C$ are respectively connected in parallel to form a first parallel circuit; one end of the first parallel circuit is connected with a first single-port on-wafer calibration piece circuit model; and the other end of the first parallel circuit is connected with a second single-port on-wafer calibration piece circuit model.

Optionally, the first single-port on-wafer calibration piece circuit model and the second single-port on-wafer calibration piece circuit model are the same circuit models.

Optionally, the first single-port on-wafer calibration piece circuit model or the second single-port on-wafer calibration piece circuit model includes a crosstalk resistor $R_S$ and a crosstalk capacitor $C_S$, wherein the crosstalk capacitor $C_S$ and the crosstalk resistor $R_S$ are connected in parallel to form a second parallel circuit; and the second parallel circuit is connected in parallel to two ends of an original single-port calibration piece circuit model.

The original single-port on-wafer calibration piece circuit model may be a load calibration piece circuit model, an open circuit calibration piece circuit model, or a short calibration piece circuit model. In this way, after a parallel circuit of the crosstalk resistor and the crosstalk capacitor is added in the original single-port on-wafer calibration piece circuit model, three kinds of single-port on-wafer calibration piece circuit models may be formed, i.e., there are three kinds of first single-port on-wafer calibration piece circuit models or second single-port on-wafer calibration piece circuit models.

Optionally, the two-port on-wafer calibration piece circuit model may be as follows: One end of the first parallel circuit is connected between the second parallel circuit in the first single-port on-wafer calibration piece circuit model and one end of a port of the original single-port calibration piece circuit model; and the other end of the first parallel circuit is connected between the second parallel circuit in the second single-port on-wafer calibration piece circuit model and one end of the port of the original single-port calibration piece circuit model.

Figure 2:
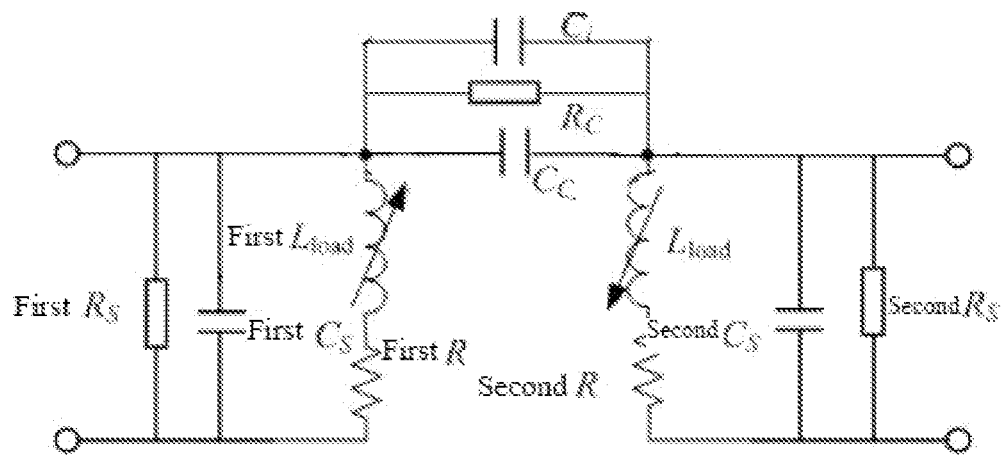
FIG. 2 is a schematic diagram of a first two-port load calibration piece circuit model according to embodiments of the present application.
Figure 3:
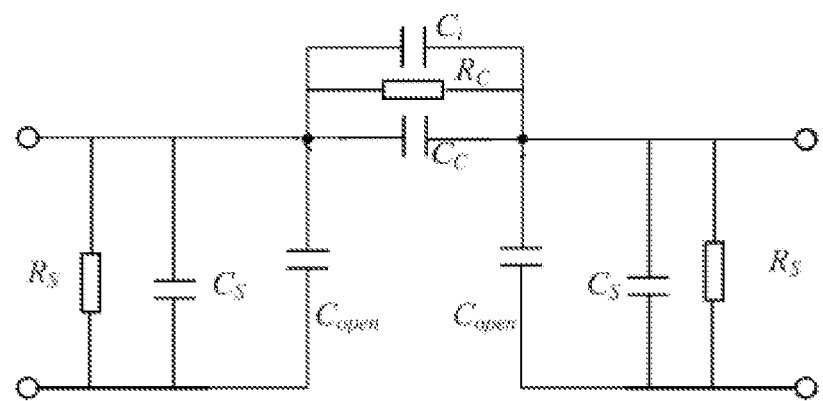
FIG. 3 is a schematic diagram of a first two-port open circuit calibration piece circuit model according to embodiments of the present application.
Figure 4:
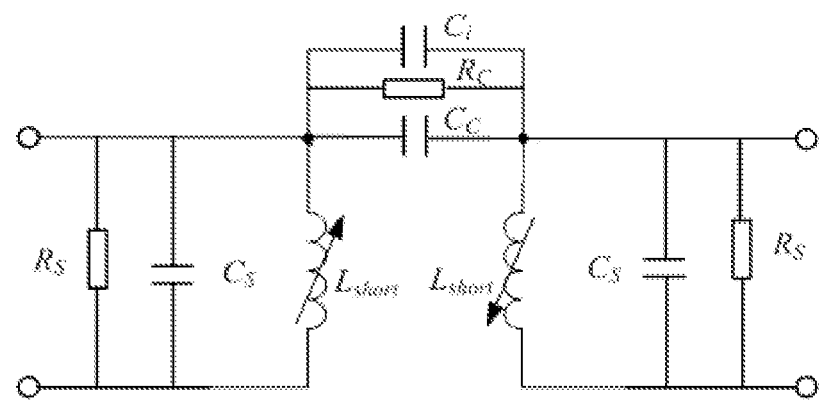
FIG. 4 is a schematic diagram of a first two-port short circuit calibration piece circuit model according to embodiments of the present application.

Due to the first single-port on-wafer calibration piece circuit model or the second single-port on-wafer calibration piece circuit model and the crosstalk elements between the two ports, there are also three kinds of two-port on-wafer calibration piece circuit models in the present embodiment, as shown in FIG. 2 to FIG. 4. FIG. 2 illustrates a first two-port load calibration piece circuit model. That is, the first two-port load calibration piece circuit model includes a first $R_S$, a first $C_S$, a first load calibration piece inductor $L_{load}$, and a calibration piece direct-current resistor $R_1$. The first load calibration piece inductor $L_{load}$ and the first load calibration piece direct-current resistor $R_1$ are connected in series; the first $R_S$ and the first $C_S$ are respectively connected in parallel to two ends of a series circuit formed by the first load calibration piece inductor $L_{load}$ the first load calibration piece direct-current resistor $R_1$; and at the same time, the structure of the second single-port on-wafer calibration piece circuit model and the structure of the first single-port on-wafer calibration piece circuit model are the same. The first parasitic capacitor, the first parasitic resistor, and the first intrinsic capacitor are respectively connected in parallel to form a first parallel circuit; one end of the first parallel circuit is connected between the first $R_S$ (or the first $C_S$) and the first load calibration piece inductor $L_{load}$, and the other end of the first parallel circuit is connected between the second $R_S$ (or the second $C_S$) and the second load calibration piece inductor.

FIG. 3 illustrates a first two-port open circuit calibration piece circuit model. A difference from the first two-port load calibration circuit model is that the first load calibration piece inductor and the first load calibration piece direct-current resistor are replaced with open circuit calibration piece capacitors. FIG. 4 illustrates a first two-port short circuit calibration piece circuit model. A difference from the first two-port load calibration circuit model is that the first load calibration piece inductor and the first load calibration piece direct-current resistor are replaced with short circuit calibration piece inductors.

For the above two-port on-wafer calibration piece circuit model, by means of adding the elements that represent the crosstalk between the two ports are added between the two single-port on-wafer calibration piece circuit models, new two-port on-wafer calibration piece circuit models are formed. As the on-wafer test efficiency increases, the accuracy of calibration and testing is higher when the two-port on-wafer calibration piece circuit model provided by the present disclosure is applied at the terahertz frequency band.

Figure 5:
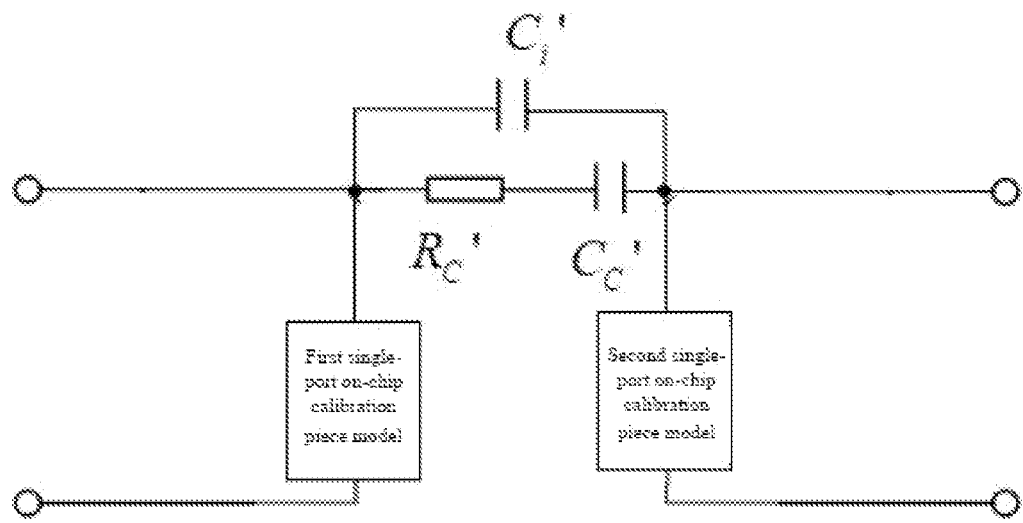
FIG. 5 is schematic diagram of a two-port on-wafer calibration piece circuit model according to another embodiment of the present application.

FIG. 5 is a schematic diagram of another two-port on-wafer calibration piece circuit model provided by the embodiments of the present application. As shown in FIG. 5, the two-port on-wafer calibration piece circuit model may include a second intrinsic capacitor $C_i'$, a second parasitic capacitor $C_C'$, and a second parasitic resistor $R_C'$; the second parasitic capacitor $C_C'$ and the second parasitic resistor $R_C'$ are connected in series to form a first series circuit; the first series circuit and the second intrinsic capacitor $C_i'$ are connected in parallel to form a third parallel circuit; one end of the third parallel circuit is connected to the first single-port on-wafer calibration piece circuit model; and the other end of the third parallel circuit is connected to the second single-port on-wafer calibration piece circuit model.

Optionally, the first single-port on-wafer calibration piece circuit model and the second single-port on-wafer calibration piece circuit model are the same circuit models.

Optionally, the first single-port on-wafer calibration piece circuit model or the second single-port on-wafer calibration piece circuit model includes a crosstalk resistor $R_S'$ and a crosstalk capacitor $C_S'$, wherein the crosstalk resistor $R_S'$ and the crosstalk capacitor $C_S'$ are connected in series to form a second series circuit; the second series circuit is connected in parallel to two ends of a port of an original single-port calibration piece circuit model; Or, the crosstalk resistor $R_S'$ and the crosstalk capacitor $C_S'$ are connected in parallel to form a fourth parallel circuit, and the fourth parallel circuit is connected in parallel to two ends of a port of an original single-port calibration piece circuit model.

The original single-port on-wafer calibration piece circuit model may be a load calibration piece circuit model, an open circuit calibration piece circuit model, or the short circuit calibration piece circuit model. In this way, after a crosstalk resistor and a crosstalk capacitor are added in the original single-port on-wafer calibration piece circuit model, six kinds of single-port on-wafer calibration piece circuit models may be formed. That is, there are six kinds of the first single-port on-wafer calibration piece circuit models or the second single-port on-wafer calibration piece circuit models.

Optionally, the two-port on-wafer calibration piece circuit model may be as follows: One end of the third parallel circuit is connected between the second series circuit in the first single-port on-wafer calibration piece circuit model and one end of a port of the original single-port calibration piece circuit model; and the other end of the third parallel circuit is connected between the second series circuit in the second single-port on-wafer calibration piece circuit model and one end of the port of the original single-port calibration piece circuit model; Or, one end of the third parallel circuit is connected between the fourth parallel circuit in the first single-port on-wafer calibration piece circuit model and one end of the port of the original single-port calibration piece circuit model; and the other end of the third parallel circuit is connected between the fourth parallel circuit in the second single-port on-wafer calibration piece circuit model and one end of the port of the original single-port calibration piece circuit model.

Figure 6:
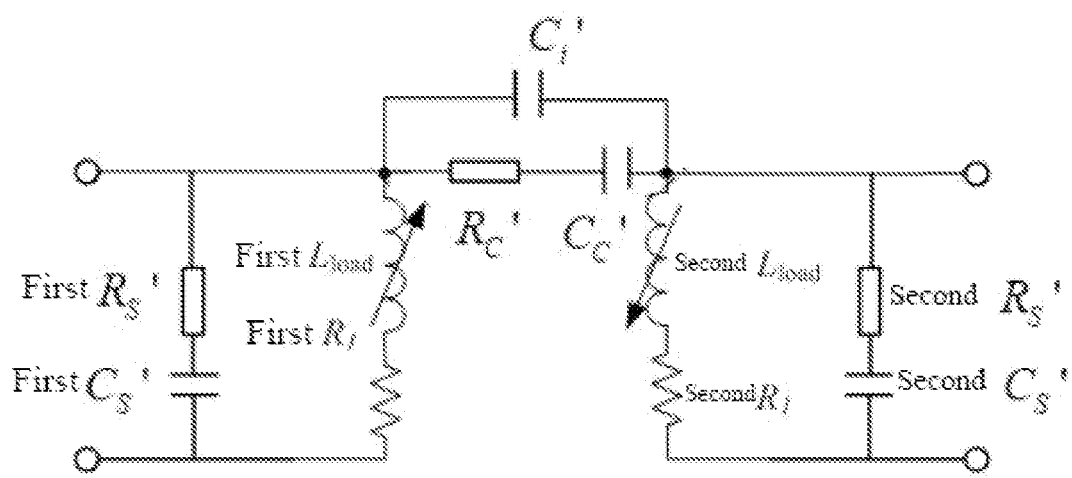
FIG. 6 is a schematic diagram of a second two-port load calibration piece circuit model according to embodiments of the present application.
Figure 7:
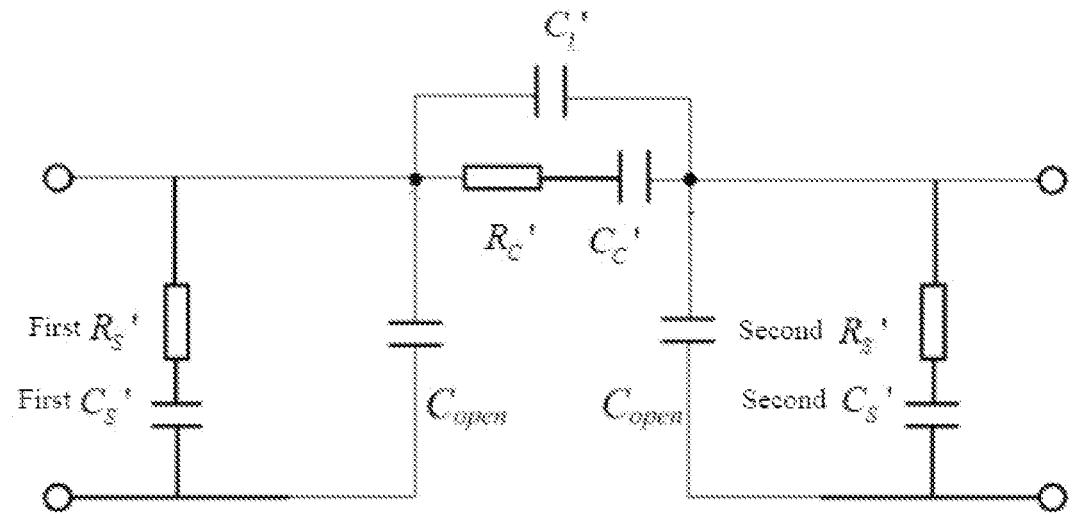
FIG. 7 is a schematic diagram of a second two-port open circuit calibration piece circuit model according to embodiments of the present application.
Figure 8:
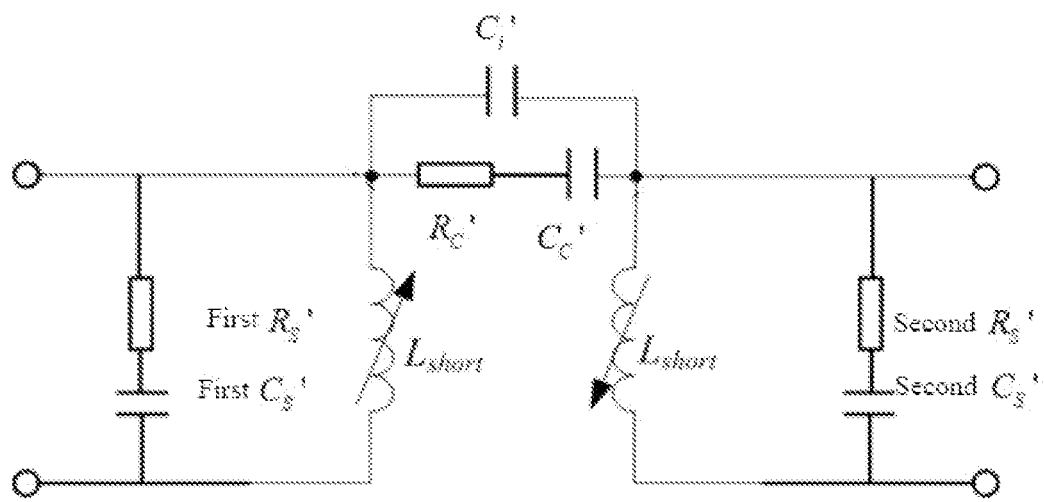
FIG. 8 is schematic diagram of a second two-port short circuit calibration piece circuit model according to embodiments of the present application.

The first single-port on-wafer calibration piece circuit model, the second single-port on-wafer calibration piece circuit model and the crosstalk element between the two ports can form six kinds of two-port on-wafer calibration piece circuit models in the present embodiment, as shown in FIG. 6 to FIG. 11. FIG. 6 to FIG. 8 illustrate two-port on-wafer calibration piece circuit models formed by connecting crosstalk resistors with crosstalk capacitors in series. FIG. 6 illustrates a second two-port load calibration piece circuit model. That is, the first single-port on-wafer calibration piece circuit model includes a first $R_S'$, a first $C_S'$, a first load calibration piece inductor $L_{load}$, and a first load calibration piece direct-current resistor $R_1$. The first $R_S'$ and the first $C_S'$ are connected in series; the first load calibration piece inductor $L_{load}$ and the first load calibration piece direct-current resistor $R_1$ are connected in series; the two series circuits are connected in parallel; and at the same time, the structure of the second single-port on-wafer calibration piece circuit model is the same as the structure of the first single-port calibration piece circuit model. The second parasitic capacitor and the second parasitic resistor are connected in parallel with the second intrinsic capacitor after being connected in series; one end of the parallel circuit is connected between the first $R_S'$ and the first load calibration piece inductor $L_{load}$; and the other end of the parallel circuit is connected between the second $R_S'$ and the second load calibration piece inductor.

FIG. 7 illustrates a second two-port open circuit calibration piece circuit model. A difference from the second two-port load calibration circuit model is that the first load calibration piece inductor and the first load calibration piece direct-current resistor are replaced with open circuit calibration piece capacitors. FIG. 8 illustrates a second two-port short circuit calibration piece circuit model. A difference from the second two-port load calibration circuit model is that the first load calibration piece inductor and the first load calibration piece direct-current resistor are replaced with short circuit calibration piece inductors.

Figure 9:
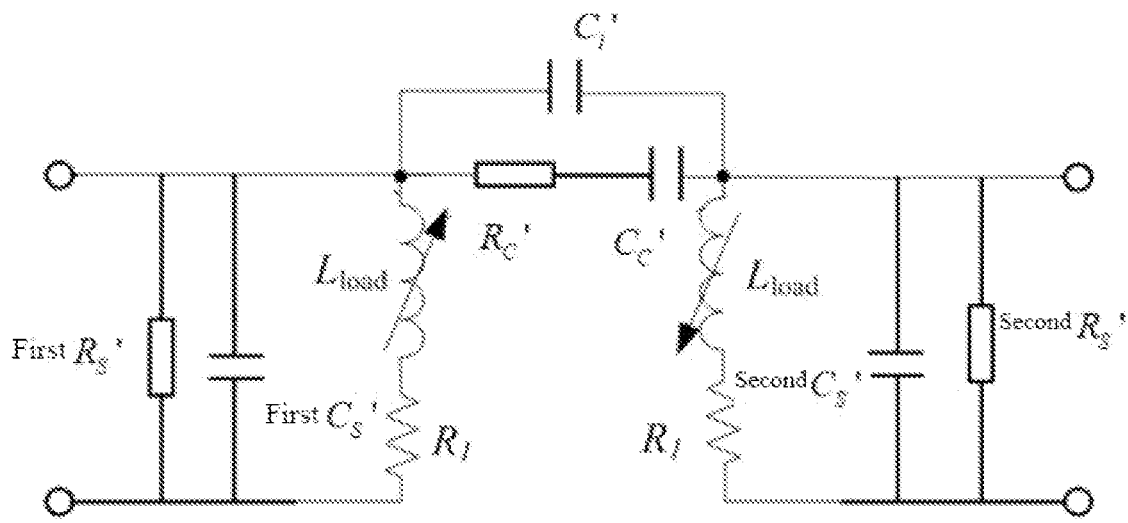
FIG. 9 is schematic diagram of a third two-port load calibration piece circuit model according to embodiments of the present application.
Figure 10:
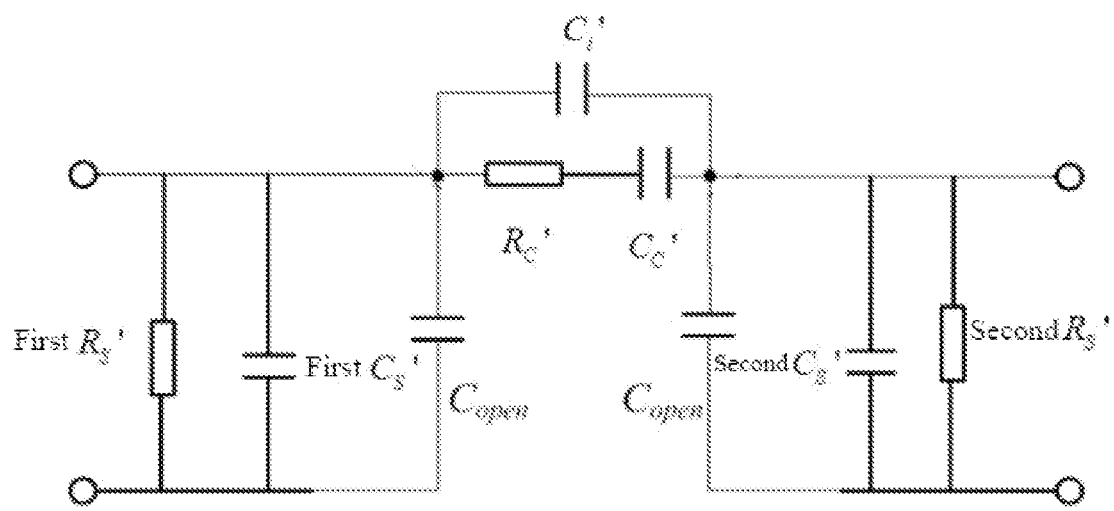
FIG. 10 is a schematic diagram of a third two-port open circuit calibration piece circuit model according to embodiments of the present application.
Figure 11:
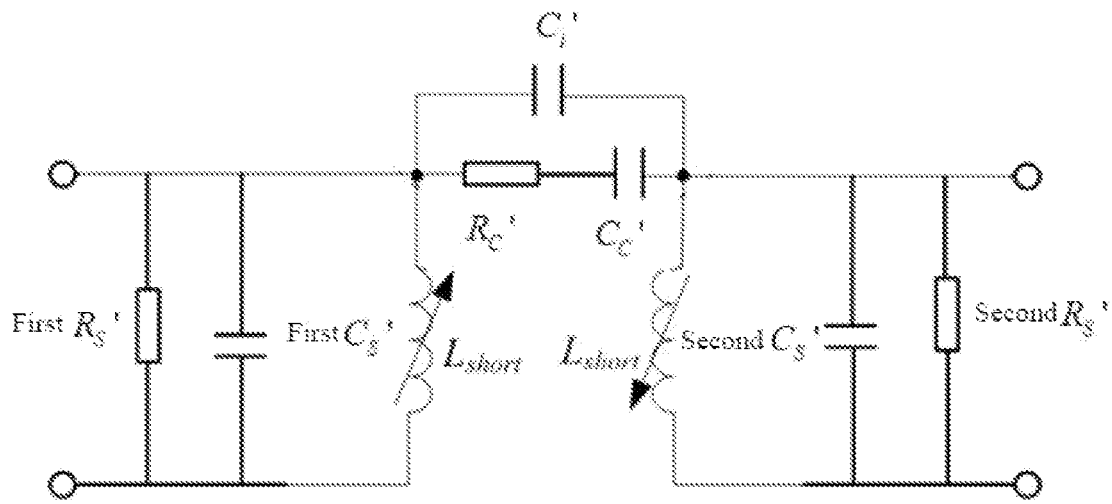
FIG. 11 is a schematic diagram of a third two-port short circuit calibration piece circuit model according to embodiments of the present application.

FIG. 9 to FIG. 11 illustrate two-port on-wafer calibration piece circuit models formed by connecting crosstalk resistors with crosstalk capacitors in parallel. FIG. 9 illustrates a third two-port load calibration piece circuit model. FIG. 10 illustrates a third two-port open circuit calibration piece circuit model. FIG. 11 illustrates a third two-port short circuit calibration piece circuit model.

For the above two-port on-wafer calibration piece circuit model, by means of adding the elements that represent the crosstalk between the two ports are added between the two single-port on-wafer calibration piece circuit models, new two-port on-wafer calibration piece circuit models are formed. As the on-wafer test efficiency increases, the accuracy of calibration and testing is higher when the two-port on-wafer calibration piece circuit model provided by the present disclosure is applied at the terahertz frequency band.

Figure 12:
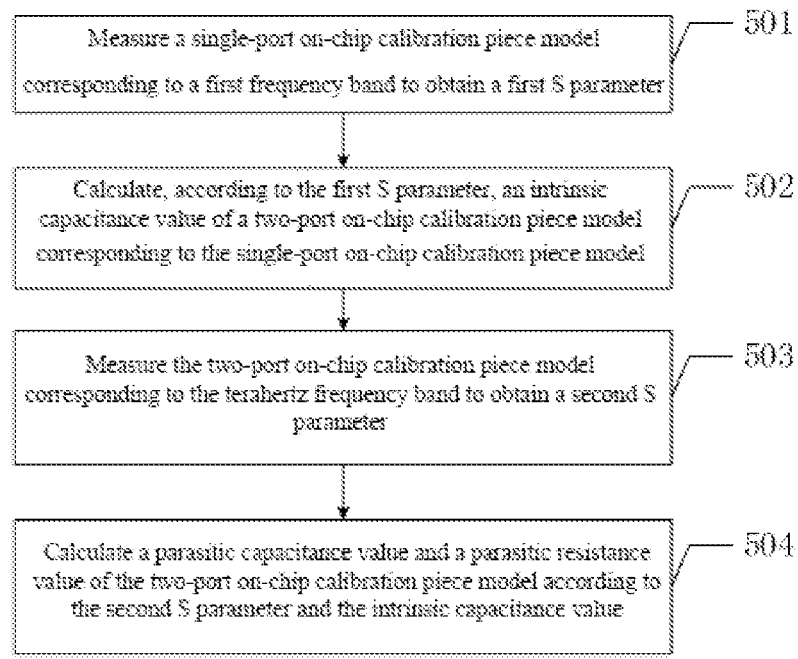
FIG. 12 is an exemplary flowchart of a method for determining parameters in a two-port on-wafer calibration piece circuit model according to embodiments of the present application.

Parameters in the two-port on-wafer calibration piece circuit model are calculated below according to the two-port on-wafer calibration piece circuit model provided in any embodiment. FIG. 12 illustrates a method for determining parameters in the two-port on-wafer calibration piece circuit model, which is described in detail below.

At step 501, a single-port on-wafer calibration piece circuit model corresponding to a first frequency band is measured to obtain a first S parameter.

Optionally, the first frequency band is a low frequency band, i.e., a frequency band of 40 GHz or below. The obtained first S parameter may be an S parameter of a single-port load calibration piece module, an S parameter of a single-port open circuit calibration piece module, or an S parameter of a single-port short circuit calibration piece module. The measurement method is the same.

At step 502, an intrinsic capacitance value of the two-port on-wafer calibration piece circuit model corresponding to the single-port on-wafer calibration piece circuit model is calculated according to the first S parameter.

Optionally, the two-port on-wafer calibration piece circuit models shown in FIG. 2 to FIG. 4 are referred. In this step, when the first S parameter is the S parameter of the single-port load calibration piece circuit model, the corresponding two-port on-wafer calibration piece circuit model is the circuit model shown in FIG. 2; when the first S parameter is the S parameter of the single-port open circuit calibration piece circuit model, the corresponding two-port on-wafer calibration piece circuit model is the circuit model shown in FIG. 3; and when the first S parameter is the S parameter of the single-port short circuit calibration piece circuit model, the corresponding two-port on-wafer calibration piece circuit model is the circuit model shown in FIG. 4.

Optionally, the two-port on-wafer calibration piece circuit models shown in FIG. 4 (1) to FIG. 4 (6). In this step, when the first S parameter is the S parameter of the single-port load calibration piece circuit model, the corresponding two-port on-wafer calibration piece circuit model is the circuit model shown in FIG. 6 or FIG. 9; when the first S parameter is the S parameter of the single-port open circuit calibration piece circuit model, the corresponding two-port on-wafer calibration piece circuit model is the circuit model shown in FIG. 7 or FIG. 10; and when the first S parameter is the S parameter of the single-port short circuit calibration piece circuit model, the corresponding two-port on-wafer calibration piece circuit model is the circuit model shown in FIG. 8 or FIG. 11.

Optionally, in this step, when the intrinsic capacitance value of a two-port on-wafer calibration piece circuit model corresponding to the single-port on-wafer calibration piece circuit model is calculated according to the first S parameter, first S matrix transformation may be performed according to a first S matrix corresponding to the first S parameter, so as to obtain $Y_{21}$ in the first Y matrix, and the intrinsic capacitance of the two-port on-wafer calibration piece circuit model is calculated according to the $Y_{21}$.

Optionally, the step that first S matrix transformation is performed according to a first S matrix corresponding to the first S parameter, so as to obtain $Y_{21}$ in a first Y matrix includes the following steps: $Y_{21}$ in the first Y matrix is obtained according to the $$\begin{cases} Y_{21} = \dfrac{-2S_{21}}{1+|S|+S_{11}+S_{22}} \\ |S| = S_{11} \cdot S_{22} - S_{21} \cdot S_{12} \end{cases},$$

where $Y_{21}$ represents an element in the first Y matrix; $S_{11}$, $S_{21}$, $S_{12}$, and $S_{22}$ respectively represent parameters in the first S matrix; and $|S|$ represents a determinant value of the first S matrix.

Optionally, the obtained first Y matrix is also a 2×2 matrix, including $Y_{11}$, $Y_{21}$, $Y_{12}$, and $Y_{22}$. In the present embodiment, the subsequent calculation is performed only by using $Y_{21}$.

Optionally, the step that the intrinsic capacitance value of the two-port on-wafer calibration piece circuit model is calculated may include the following steps: the intrinsic capacitance value of the two-port on-wafer calibration piece circuit model is calculated according to $$C_i = \dfrac{-Y_{21}}{j\omega},$$

where $C_i$ represents the intrinsic capacitance value; j represents an imaginary number; and ω represents an angular frequency corresponding to the first frequency band. $\omega = 2\pi f_1$, $f_1$ represents frequencies in the first frequency band.

The calculation method of the intrinsic capacitance value $C_i'$ is the same as the calculation method of the intrinsic capacitance value $C_i$.

At step 503, the two-port on-wafer calibration piece circuit model corresponding to the terahertz frequency band is calculated to obtain a second S parameter.

According to the two-port on-wafer calibration piece circuit model directly measured in the terahertz frequency band, a corresponding two-port S parameter may be obtained, which is recorded as the second S parameter. The second S parameter is also a 2×2 matrix, including $S_{11}$, $S_{21}$, $S_{12}$, and $S_{22}$.

At step 504, a parasitic capacitance value and a parasitic resistance value of the two-port on-wafer calibration piece circuit model are calculated according to the second S parameter and the intrinsic capacitance value.

Optionally, in this step, second S matrix transformation may be firstly performed according to a second S matrix corresponding to the second S parameter, so as to obtain $Y_{21}'$ in a second Y matrix; and the parasitic capacitance value and a parasitic resistance value of the two-port on-wafer calibration piece circuit model are calculated according to the $Y_{21}'$ and the intrinsic capacitance value.

Optionally, in this step, the calculation method for performing second S matrix transformation according to a second S matrix corresponding to the second S parameter to obtain $Y_{21}'$ in a second Y matrix is the same as the calculation method for calculating the $Y_{21}$ in the first Y matrix in the step 502, and descriptions thereof are omitted here.

Optionally, FIG. 2 to FIG. 4 may be regarded as a π-type network consisting of three admittances, thus obtaining $$-Y_{21}' - j*w'*C_i = \frac{1}{R_C} + j*w'*C_C$$

and then obtaining $$R_C = \frac{1}{\text{real}(-Y_{21}' - j*w'*C_i)}$$

and $$C_C = \frac{\text{imag}(-Y_{21}' - j*w'*C_i)}{w'}.$$

That is, the parasitic capacitance value and the parasitic resistance value of the two-port on-wafer calibration piece circuit model are calculated according to $$\begin{cases} -Y_{21}' - j*w'*C_i = \frac{1}{R_C} + j*w'*C_C \\ R_C = \frac{1}{\text{real}(-Y_{21}' - j*w'*C_i)} \\ C_C = \frac{\text{imag}(-Y_{21}' - j*w'*C_i)}{w'} \end{cases},$$

where w' represents an angular frequency corresponding to the terahertz frequency band; ω'=2πf$_2$, f$_2$ represents a frequency in the terahertz frequency band; $R_C$ represents a first parasitic capacitance value, and $C_C$ represents a first parasitic resistance value.

The parameters in the three kinds of circuit models as shown in FIG. 2 to FIG. 4 all can be obtained according to the calculations of the above steps.

Optionally, FIG. 6 to FIG. 8 or FIG. 9 to FIG. 11 may be regarded as a π-type network consisting of three admittances, thus obtaining $$j*w'*C_i' + \frac{1}{R_C' + \frac{1}{j*w'*C_C'}} = -Y_{21}'.$$

The form is changed to obtain $$\frac{1}{-Y_{21}' - j*w'*C_i'} = R_C' + \frac{1}{j*w'*C_C'},$$

thus obtaining $$R_C' = \text{real}\frac{1}{(-Y_{21}' - j*w'*C_i')}$$

and $$C_C' = \frac{1}{w\cdot\text{imag}\left(\frac{1}{Y_{21}' + j*w'*C_i'}\right)}.$$

That is, the parasitic capacitance value and the parasitic resistance value of the two-port on-wafer calibration piece circuit model are calculated according to $$\begin{cases} \frac{1}{-Y_{21}' - j*w'*C_i'} = R_C' + \frac{1}{j*w'*C_C'} \\ R_C' = \text{real}\left(\frac{1}{-Y_{21}' - j*w'*C_i'}\right) \\ C_C' = \frac{1}{w\cdot\text{imag}\left(\frac{1}{Y_{21}' + j*w'*C_i'}\right)} \end{cases},$$

where w' represents an angular frequency corresponding to the terahertz frequency band; ω'=2πf$_2$, f$_2$ represents a frequency in the terahertz frequency band; $C_C'$ represents a second parasitic capacitance value, and $R_C'$ represents a second parasitic resistance value.

The parameters in the three kinds of circuit models as shown in FIG. 6 to FIG. 4 (6) all can be obtained according to the calculations of the above steps.

According to the method for determining the parameters in the two-port on-wafer calibration piece circuit model, the first S parameter is obtained by measuring the single-port on-wafer calibration piece circuit model corresponding to the first frequency band; the intrinsic capacitance value of the two-port on-wafer calibration piece circuit model corresponding to the one-port on-wafer calibration piece circuit model is calculated according to the first S parameter; the second S parameter is obtained by calculating the two-port on-wafer calibration piece circuit model corresponding to the terahertz frequency band; and the parasitic capacitance value and the parasitic resistance value of the two-port on-wafer calibration piece circuit model are calculated according to the second S parameter and the intrinsic capacitance value. The various two-port on-wafer calibration piece circuit models provided by the embodiments of the present disclosure reduce calibration and measurement errors caused by imperfection of the original single-port calibration piece circuit model in the terahertz frequency band and improves the test accuracy of on-wafer S parameters in the terahertz frequency band. In addition, the embodiments of the present disclosure further provide a method for calculating parameters in the two-port on-wafer calibration piece circuit model.

It should be understood that the serial numbers of all the steps in the above embodiment do not mean the order of execution. The order of execution of the all processes shall be determined by their functions and an internal logic, and shall not constitute any limitations to the implementation processes of the embodiments of the present application.

The above-mentioned embodiments are only used to illustrate the technical solutions of the present application, not intended to limit them. Although the present application has been described in detail with reference to the foregoing embodiments, those of ordinary skill in the art should understand that they still can modify the technical solutions recorded in all the foregoing embodiments, or replace partial technical features by equivalences. These modifications or replacements do not cause the essences of the corresponding technical solutions to depart from the spirit and scope of the technical solutions of all the embodiments of the present application, and shall fall within the protection scope of the present application.

The invention claimed is:

1. A two-port on-wafer calibration piece circuit model, comprising:
a second intrinsic capacitor, a second parasitic capacitor, and a second parasitic resistor;
wherein the second parasitic capacitor and the second parasitic resistor are connected in series and form a first series circuit, the first series circuit and the second intrinsic capacitor are connected in parallel and form a third parallel circuit, a first end of the third parallel circuit is connected to a third single-port on-wafer calibration piece circuit model, and a second end of the third parallel circuit is connected to a fourth single-port on-wafer calibration piece circuit model; and
wherein each of the third single-port on-wafer calibration piece circuit model and the fourth single-port on-wafer calibration piece circuit model comprises a crosstalk resistor $R_S'$, a crosstalk capacitor $C_S'$ and a second original single-port calibration piece circuit model, wherein
the crosstalk capacitor $R_S'$ and the cross talk resistor $C_S'$ are connected in series and form a second series circuit, the second series circuit is connected in parallel to the second original single-port calibration piece circuit model, the second series circuit is connected between two ends of a port of the second original single-port calibration piece circuit model, and a first end of the second series circuit is connected to one of the two ends of the port of the second original single-port calibration piece circuit model to form a second connecting point; or
the crosstalk resistor $R_S'$ and the crosstalk capacitor $C_S'$ are connected in parallel and form a fourth parallel circuit, the fourth parallel circuit is connected in parallel to the second original single-port calibration piece circuit model, the fourth parallel circuit is connected between two ends of the second original single-port calibration piece circuit model, and a first end of the fourth parallel circuit is connected to one of the two ends of the port of the second original single-port calibration piece circuit model to form a third connecting point.

2. The circuit model according to claim 1, wherein
when the crosstalk capacitor $R_S'$ and the crosstalk resistor $C_S'$ are connected in series, the first end of the third parallel circuit is connected to the second connecting point of the third single-port on-wafer calibration piece circuit model, and the second end of the third parallel circuit is connected to the second connecting point of the fourth single-port on-wafer calibration piece circuit model; or
when the crosstalk resistor $R_S'$ and the crosstalk capacitor $C_S'$ are connected in parallel, the first end of the third parallel circuit is connected to the third connecting point of the third single-port on-wafer calibration piece circuit model, and the second end of the third parallel circuit is connected to the third connecting point of the fourth single-port on-wafer calibration piece circuit model.

* * * * *